(12) United States Patent
Bach

(10) Patent No.: US 10,447,262 B2
(45) Date of Patent: Oct. 15, 2019

(54) COOKING APPLIANCE AND KNOB ASSEMBLY REMOVABLY MOUNTED TO A CONTROL PANEL OF THE COOKING APPLIANCE

(71) Applicant: Haier US Appliance Solutions, Inc., Wilmington, DE (US)

(72) Inventor: James Carter Bach, Westfield, IN (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 148 days.

(21) Appl. No.: 15/487,486

(22) Filed: Apr. 14, 2017

(65) Prior Publication Data

US 2018/0301301 A1 Oct. 18, 2018

(51) Int. Cl.
*H03K 17/94* (2006.01)
*H03K 17/97* (2006.01)
*F24C 7/08* (2006.01)

(52) U.S. Cl.
CPC ........... *H03K 17/941* (2013.01); *F24C 7/082* (2013.01); *H03K 17/97* (2013.01)

(58) Field of Classification Search
CPC ........... H01H 25/002; H01H 2219/062; H01H 2219/036; F24C 7/081; F24C 3/122; F24C 7/082; H03K 17/941; H03K 17/97
See application file for complete search history.

(56) References Cited

U.S. PATENT DOCUMENTS

| | | | |
|---|---|---|---|
| 3,711,672 A | 1/1973 | Moreland, II et al. | |
| 4,158,216 A * | 6/1979 | Bigelow | H03K 17/98 |
| | | | 200/600 |
| 4,914,831 A * | 4/1990 | Kanezashi | G01B 3/12 |
| | | | 33/780 |
| 5,920,131 A | 7/1999 | Platt et al. | |
| 6,188,332 B1 | 2/2001 | Scarlata | |
| 6,498,326 B1 | 12/2002 | Knappe | |
| 6,838,785 B2 | 1/2005 | Schilling | |
| 6,998,585 B2 * | 2/2006 | Erdmann | F24C 7/083 |
| | | | 219/443.1 |
| 7,038,667 B1 | 5/2006 | Vassallo et al. | |
| 7,642,673 B2 * | 1/2010 | Baier | F24C 7/082 |
| | | | 307/104 |
| 7,642,886 B2 | 1/2010 | Boss | |
| 8,217,742 B2 | 7/2012 | Trudeau et al. | |
| 8,440,945 B2 | 5/2013 | Blumenthal et al. | |
| 8,662,071 B2 | 3/2014 | Simmons | |
| 2005/0077166 A1 * | 4/2005 | Kim | H01H 19/025 |
| | | | 200/564 |

(Continued)

FOREIGN PATENT DOCUMENTS

| CN | 101741367 A | 6/2010 |
|---|---|---|
| CN | 204786647 U | 11/2015 |

(Continued)

*Primary Examiner* — Thanh Luu
*Assistant Examiner* — Jennifer D Bennett
(74) *Attorney, Agent, or Firm* — Dority & Manning, P.A.

(57) ABSTRACT

A cooking appliance and knob assembly are generally provided herein. The knob assembly may include a control panel and a control knob disposed thereon. The knob assembly may further include one or more of an attractor plate, a lighting assembly, and a repelling assembly that operably engage the control knob at a knob body.

15 Claims, 12 Drawing Sheets

(56) References Cited

U.S. PATENT DOCUMENTS

| | | | |
|---|---|---|---|
| 2010/0253653 A1 | 10/2010 | Stambaugh et al. | |
| 2013/0062176 A1* | 3/2013 | Schuh | H03K 17/962 200/5 A |
| 2013/0343588 A1 | 12/2013 | Karunasiri | |
| 2014/0021024 A1* | 1/2014 | Heimann | G05G 5/065 200/4 |
| 2016/0069712 A1* | 3/2016 | Holenarsipur | G01D 5/3473 250/231.13 |
| 2016/0181028 A1* | 6/2016 | Ebrom | H01H 19/025 362/23.04 |
| 2017/0052617 A1* | 2/2017 | Okuzumi | B60R 16/02 |
| 2018/0301301 A1* | 10/2018 | Bach | H01H 25/002 |

FOREIGN PATENT DOCUMENTS

| | | |
|---|---|---|
| CN | 103794397 B | 12/2015 |
| DE | 19859105 A1 | 6/2000 |
| DE | 10035592 A1 | 1/2002 |
| DE | 10229629 A1 | 1/2004 |
| DE | 102004013947 B3 | 12/2005 |
| DE | 102010039559 A1 | 2/2012 |
| EP | 0797227 A2 | 9/1997 |
| WO | WO2012118455 A2 | 9/2012 |
| WO | WO2013122555 A2 | 8/2013 |

\* cited by examiner

COOKING APPLIANCE AND KNOB ASSEMBLY REMOVABLY MOUNTED TO A CONTROL PANEL OF THE COOKING APPLIANCE

FIELD OF THE INVENTION

The present subject matter relates generally to control knobs on an appliance, such as a cooking appliance.

BACKGROUND OF THE INVENTION

Knobs are commonly used on a variety of commercial and residential appliances to control an operating condition of the appliance. Knobs are particularly common on cooking appliances, such as stoves or cooktops. Various shapes and sizes can be used depending upon e.g., the intended application, aesthetics, and other factors.

As an example, cooking appliances that include a cooktop traditionally have at least one heating element positioned on a panel proximate a cooktop surface for use in heating or cooking an object, such as a cooking utensil, and its contents. The heating element can operate to heat a cooking utensil directly through induction heating, or may use another heat source such as electrically resistant coils or gas burners. Generally, a control knob may be fixed through a panel of the cooking appliance to engage a controller behind the panel, or otherwise within the cooking appliance.

Certain challenges exist with this construction, however. For instance, this construction typically requires one or more holes to be defined through the panel in order for the control knob to engage the controller. In turn, it is possible that solid or liquid food items may fall through the holes, potentially leading to damage of the controller or other internal components. Furthermore, these holes may make it difficult to clean the appliance, especially within the area beneath the panel.

Concerns may also arise with a knob assembly that is fixed to the cooking appliance. As an example, inadvertently striking the knob may cause a portion of the cooking appliance to break. As another example, the heating element may be accidentally activated, such as by a careless bystander or small child. Thus, in certain situations, it may be preferable to remove the control knob and/or prevent the heating element from being activated.

Accordingly, an improved control knob assembly would be beneficial. In particular, it may be advantageous to provide a control knob assembly that does not require a hole through a surface of an appliance (i.e., the surface on which a control knob is supported). Moreover, it may be advantageous to provide a control knob that can be easily removed from and remounted to an appliance without causing damage thereto.

BRIEF DESCRIPTION OF THE INVENTION

Aspects and advantages of the invention will be set forth in part in the following description, or may be obvious from the description, or may be learned through practice of the invention.

In one aspect of the present disclosure, a knob assembly for an appliance is provided. The knob assembly may include a control panel, a control knob, an attractor plate, and an electrical position sensor. The control panel may have a planar outer surface and an opposite inner surface. The control knob may be selectively disposed on the control panel at the planar outer surface. The control knob may include a knob body and a first magnetic assembly rotatable about a central axis extending perpendicular to the control panel. The attractor plate may be mounted behind the control panel about the central axis. The attractor plate may include a second magnetic assembly in selective magnetic engagement with the first magnetic assembly. The electrical position sensor may be directed at the attractor plate and configured to detect positioning of the attractor plate about the central axis.

In another aspect of the present disclosure, a knob assembly for an appliance is provided. The knob assembly may include a control panel, a control knob, and a lighting assembly. The control panel may have a planar outer surface and an opposite inner surface. The control knob may be disposed on the control panel at the planar outer surface. The control knob may include a knob body that is rotatable about a central axis extending perpendicular to the control panel. The control knob may further include a central light guide disposed within the knob body along the central axis. The lighting assembly may be mounted behind the control panel. The lighting assembly may be directed towards the knob body to transmit a light emission through the central light guide.

In yet another aspect of the present disclosure, a knob assembly for an appliance is provided. The knob assembly may include a control panel, a control knob, and a repelling assembly. The control panel may have a planar outer surface and an opposite inner surface. The control knob may be disposed on the control panel at the planar outer surface. The control knob may include a knob body that is rotatable about a central axis extending perpendicular to the control panel. The control knob may further include a slidable member supported on the knob body to move along the central axis in selective engagement with the outer surface at the mounted position. The repelling assembly may bias the slidable member away from the outer surface at the mounted position.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
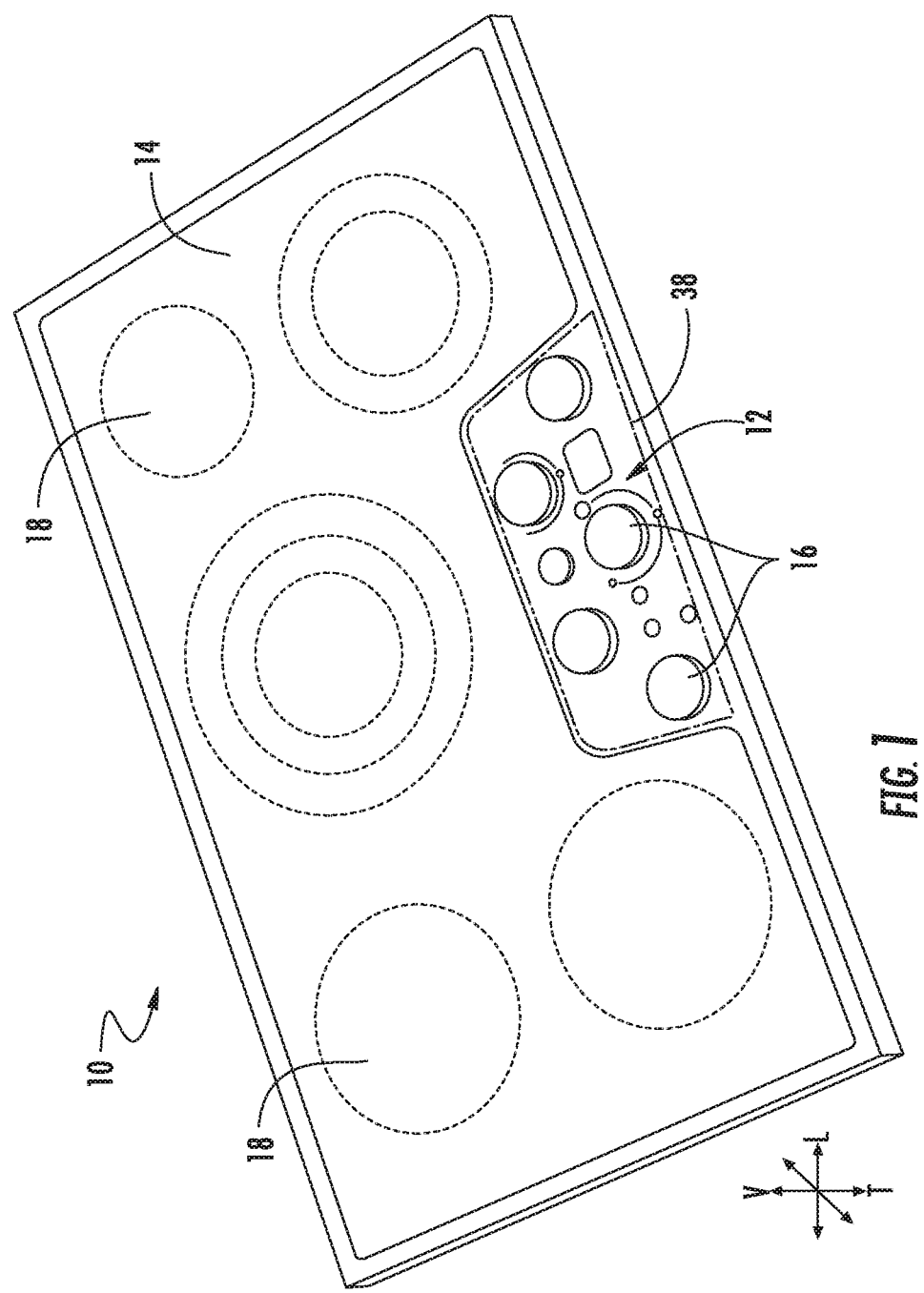
FIG. 1 provides a perspective view of a cooking appliance according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, some aspects of the present disclosure provide a control knob that is removably mounted on top of a control panel of an appliance. The control panel may be a substantially solid surface, free of any holes through which the control knob can be inserted. The control knob may rotate on the control panel to control operation of the appliance. A magnetic connection or coupling may form between the control knob and a relative position sensor. Thus, as the control knob rotates on top of the control panel, the electrical position sensor may detect the position or movement and communicate to controller or other portion of the appliance.

Referring now to the figures, FIG. 1 illustrates an example embodiment of a cooking appliance 10, according to the present disclosure. Cooking appliance 10 generally defines a vertical direction V, a lateral direction L, and a transverse direction T. The vertical direction V, lateral direction L, and transverse direction T are each mutually perpendicular and form an orthogonal direction system.

Cooking appliance 10 may be, e.g., fitted integrally with a surface of a kitchen counter, or be a part of a range appliance. Cooking appliance 10 can include a chassis (not shown) and a cooktop surface 14 having one or more heating elements 18 for use in, e.g., heating or cooking operations. In one example embodiment, cooktop surface 14 is comprised of ceramic glass. In other embodiments, however, cooktop surface 14 may be comprised of another suitable material, such as a metallic material (e.g., steel) or another suitable non-metallic material. Heating elements 18 may be various sizes, as shown in FIG. 1, and may employ any suitable method for heating or cooking an object, such as a cooking utensil (not shown), and its contents. In one embodiment, for example, heating element 18 uses a heat transfer method, such as electric coils or gas burners, to heat the cooking utensil. In another embodiment, however, heating element 18 uses an induction heating method to heat the cooking utensil directly. In turn, heating element 18 may include a gas burner element, electric heat element, induction element, or another suitable heating element.

During use of cooking appliance 10, the amount of heat delivered by each heating element 18 on cooktop surface 14 is controlled by a controller 38 and control knob 16, as described in detail below. Optionally, each control knob 16 may correspond to a discrete heating element 18. Knob 16, as used herein, refers to any configuration of dial, and not just one having a circular base shape, as shown in FIG. 1. For example, the present disclosure contemplates example embodiments wherein knobs 16 have a rectangular base shape, an ovular base shape, or any other shape having one or more curved lines, straight lines, or both.

In turn, in some embodiments of cooking appliance 10, controller 38 may be configured to control one or more operations of cooking appliance 10. For example, controller 38 may control at least one operation of cooking appliance 10 that includes an internal heating element or cooktop heating element 18. Controller 38 may be in communication (via for example a suitable wired or wireless connection) with one or more of heating element(s) 18 and other suitable components of cooking appliance 10.

By way of example, controller 38 may include one or more memory devices and one or more microprocessors, such as general or special purpose microprocessors operable to execute programming instructions or micro-control code associated with an operating cycle. The memory devices or memory may represent random access memory such as DRAM, or read only memory such as ROM or FLASH. In one embodiment, the processor executes programming instructions stored in memory. The memory may be a separate component from the processor or may be included onboard within the processor.

Controller 38 may be positioned in a variety of locations throughout cooking appliance 10. As illustrated, controller 38 may be located within cooking appliance 10, e.g., behind or beneath cooktop surface 14. In some such embodiments, input/output ("I/O") signals may be routed between controller 38 and various operational components of cooking appliance 10, such as heating element(s) 18, control knobs 16, display components, sensors, alarms, and/or other components as may be provided. For instance, signals may be directed along one or more wiring harnesses that may be routed through appliance 10. In some embodiments, controller 38 is in communication with knob assembly 12 and control knobs 16 through which a user may select various operational features and modes and monitor progress of cooking appliance 10.

Turning to FIGS. 2 through 7, an example knob assembly 12 is illustrated. In some embodiments, knob assembly 12 includes a flat control panel 22 that is substantially solid or free of any holes through which a portion of a control knob or water may pass. Control panel 22, as used herein, refers to any surface of cooking appliance 10, such as cooktop surface 14 (FIG. 1). For example, the present disclosure contemplates example embodiments where the entirety of cooktop surface 14 is comprised of a single suitable material. The present disclosure also contemplates other embodiments where cooktop surface 14 is comprised of one material proximate to heating elements 18 (e.g., metal), and control panel 22 is comprised of another material that is non-magnetic and/or non-metallic (e.g., plastic, glass, glass ceramic, etc.) proximate to control knob(s) 16. Control panel 22 may extend perpendicular to vertical direction V, as shown, or at another suitable angle relative thereto.

Generally, control panel 22 provides two opposing surfaces. Specifically, control panel 22 includes an outer surface 24 and an inner surface 26. As shown, outer surface 24 may be substantially planar and extend along a constant angle, e.g., horizontally or perpendicular to the vertical direction V. Although it is understood that control panel 22 may be disposed at any suitable orientation, when mounted horizontally (similar to the embodiment of FIG. 1), outer surface 24 is generally directed (i.e., faces) upward along the vertical direction V while inner surface 26 is generally directed downward along the vertical direction V.

Figure 2:
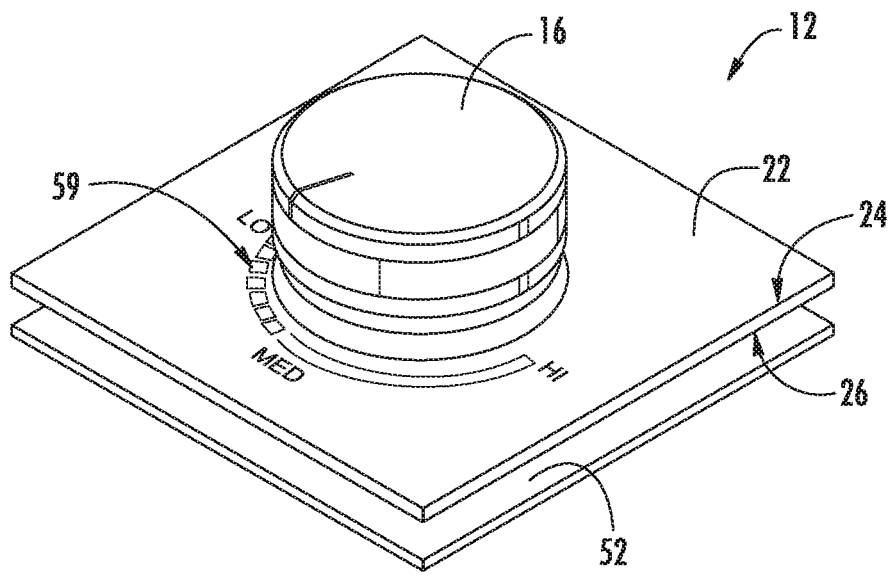
FIG. 2 provides a top perspective view of a knob assembly according to example embodiments of the present disclosure, wherein the control knob is in a mounted position on a control panel.
Figure 3:
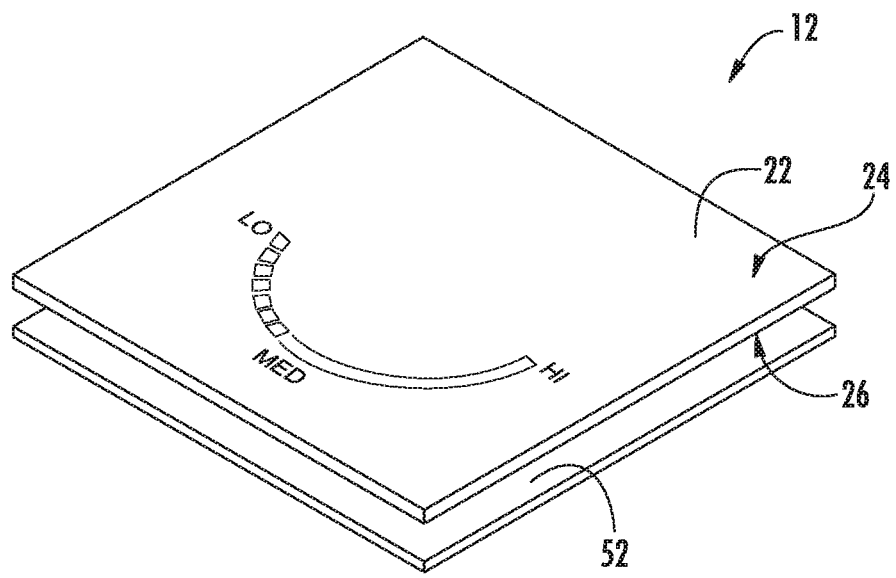
FIG. 3 provides a top perspective view of a portion of the example knob assembly of FIG. 2, wherein the control knob is in an unmounted position relative to the control panel.

Control knob 16 may be selectively (i.e., removably) disposed on control panel 22 to assume a mounted position, as shown in FIG. 2. Conversely, control knob 16 may be removed or unmounted from control panel 22 in an unmounted position, as shown in FIG. 3. In the mounted position, control knob 16 is generally positioned on or at outer surface 24, e.g., in contact therewith. Thus, control knob 16 is disposed closer to outer surface 24 than inner surface 26. In turn, at least a portion of control knob 16 may engage or contact planar outer surface 24. In the mounted position, control knob 16 is rotatable about a central axis A. During operations, control knob 16 may thus rotate along or above control panel 22. In embodiments wherein control panel 22 extends horizontally (similar to the embodiment of FIG. 1), central axis A may be parallel to the vertical direction V. Moreover, control panel 22, e.g., planar outer surface 24, may extend perpendicular to the central axis A.

In the mounted position, control knob 16 is disposed above or forward from control panel 22 along the central axis A. As shown, control knob 16 does not extend into or through control panel 22. When assembled, control panel 22 may be a substantially solid surface, at least within a footprint defined by control knob 16 in the mounted position. Advantageously, control panel 22 may thus prevent spilled liquids or food items from passing therethrough. Moreover, control panel 22 may be easily cleaned, e.g., when control knob 16 is unmounted and removed therefrom.

One or both of an interior attractor plate 28 and an electrical position sensor 40 may be mounted below or behind control panel 22 e.g., at the inner surface 26 within the footprint of control knob 16. Thus, attractor plate 28 and electrical position sensor 40 may be disposed opposite control knob 16. For instance, attractor plate 28 may be freely mounted within a compartment 42 defined behind control panel 22. Compartment 42 may be defined, at least partially, by a retainer ring 30 that bounds attractor plate 28 in the radial direction R. In other words, retainer ring 30 may be disposed radially outward from attractor plate 28. Compartment 42 may be further defined by one or more printed circuit boards 52, 54 and/or control panel 22 that bound attractor plate 28 at axial extremes (e.g., a top portion and a bottom portion) of compartment 42. Although control panel 22 extends between control knob 16 and attractor plate 28, attractor plate 28 and electrical position sensor 40 may be operably engaged with control knob 16 in the mounted position, as will be described in greater detail below.

In the mounted position, a magnetically-coupled pair selectively couples control knob 16 and attractor plate 28. The pair may include at least a first magnetic assembly 34 and a second magnetic assembly 36. Generally, first magnetic assembly 34 and second magnetic assembly 36 are attracted to each other by a magnetic field generated by the pair. First magnetic assembly 34 is included within the knob body 32 of control knob 16. Second magnetic assembly 36 is included within attractor plate 28.

Both first magnetic assembly 34 and second magnetic assembly 36 include at least one magnetic element, e.g., radial magnetic elements 44, 46). These magnetic elements may be formed from any material that is suitably responsive to a magnetic field and/or capable of generating a magnetic field. In other words, the magnetic elements (e.g., radial magnetic elements 44, 46) are not formed from a purely diamagnetic material. For instance, the magnetic elements may be permanent magnet, ferromagnetic element, or electromagnetic element.

First magnetic assembly 34 and second magnetic assembly 36 may be generally formed to mirror or compliment the other in the mounted position. When control knob 16 is in the mounted position, radial magnetic elements 44, 46 of first magnetic assembly 34 and second magnetic assembly 36 are magnetically engaged or coupled to rotate about central axis A. At least one radial magnetic element 44 of the first magnetic assembly 34 is aligned with a radial magnetic element 46 of the second magnetic assembly 36 radially outward from the central axis A. By contrast, removing control knob 16 from control panel 22 (e.g., to the unmounted position) may break the magnetic engagement and allow control knob 16 to move freely with respect to control panel 22 while the at least one magnetic element 46 of the second magnetic assembly 36 remains radially outward from the central axis A.

Figure 4:
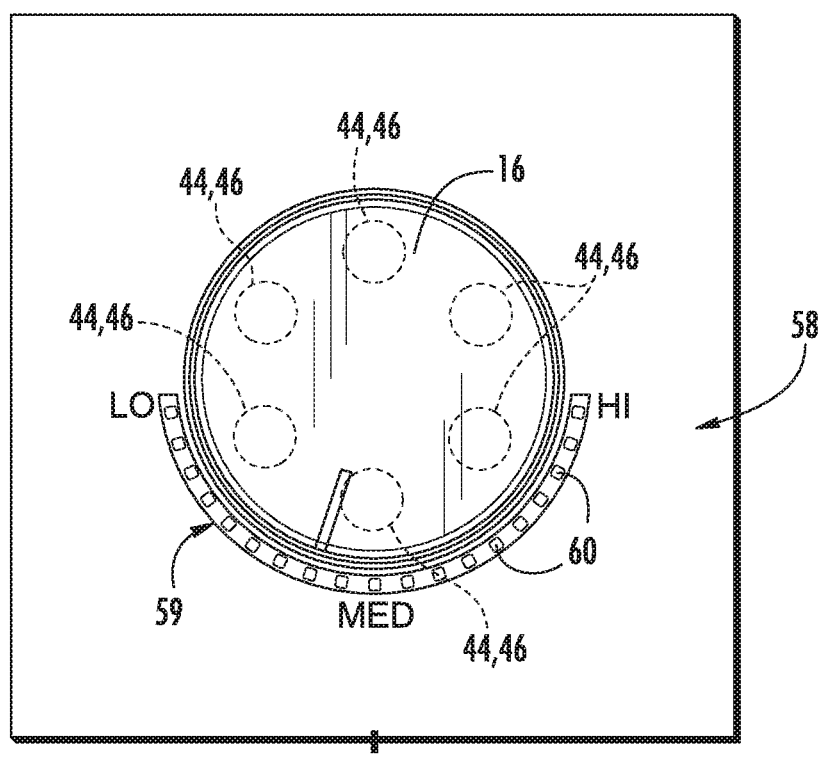
FIG. 4 provides a top view of the example knob assembly of FIG. 2.
Figure 5:
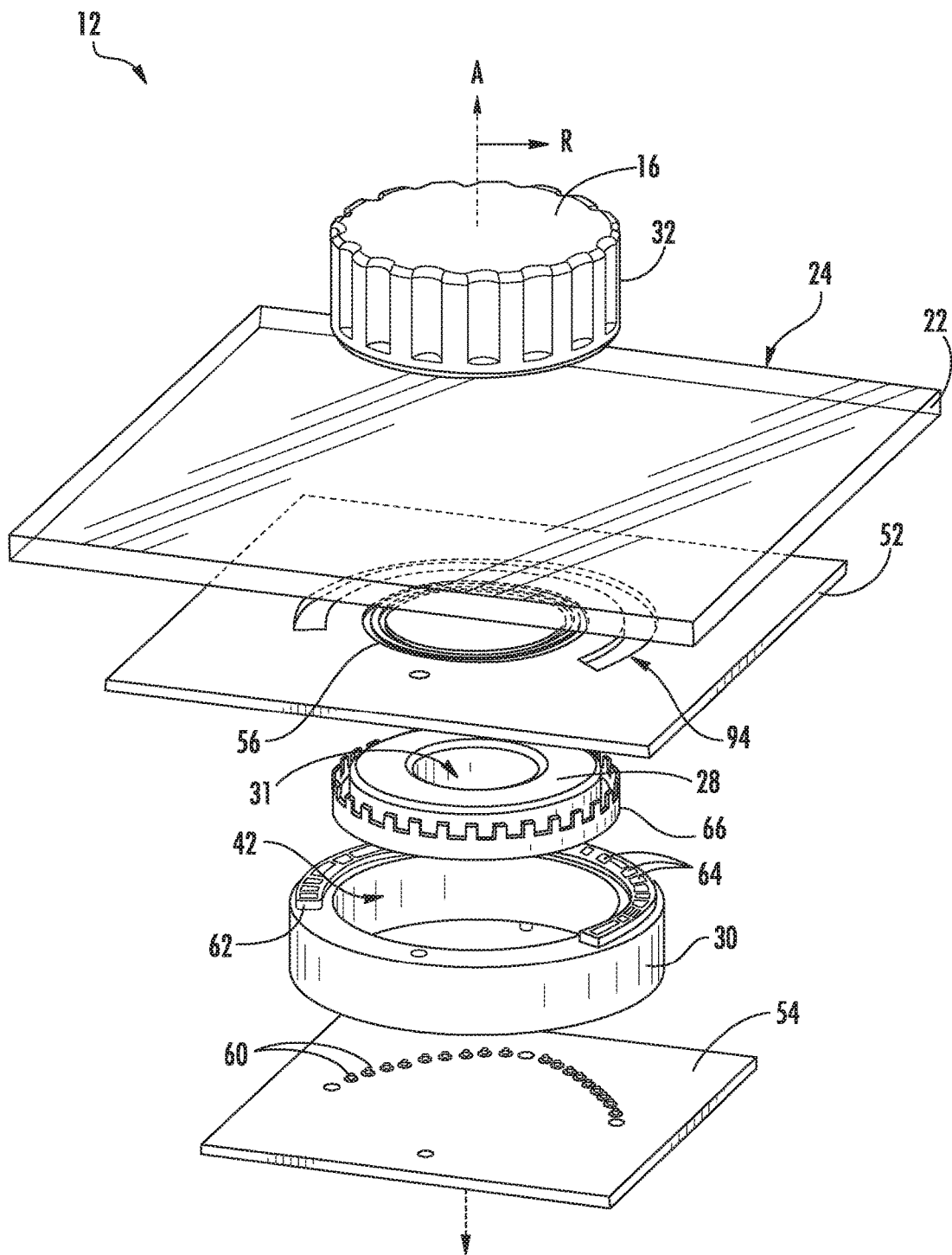
FIG. 5 provides an exploded top perspective view of a knob assembly according to example embodiments of the present disclosure.
Figure 6:
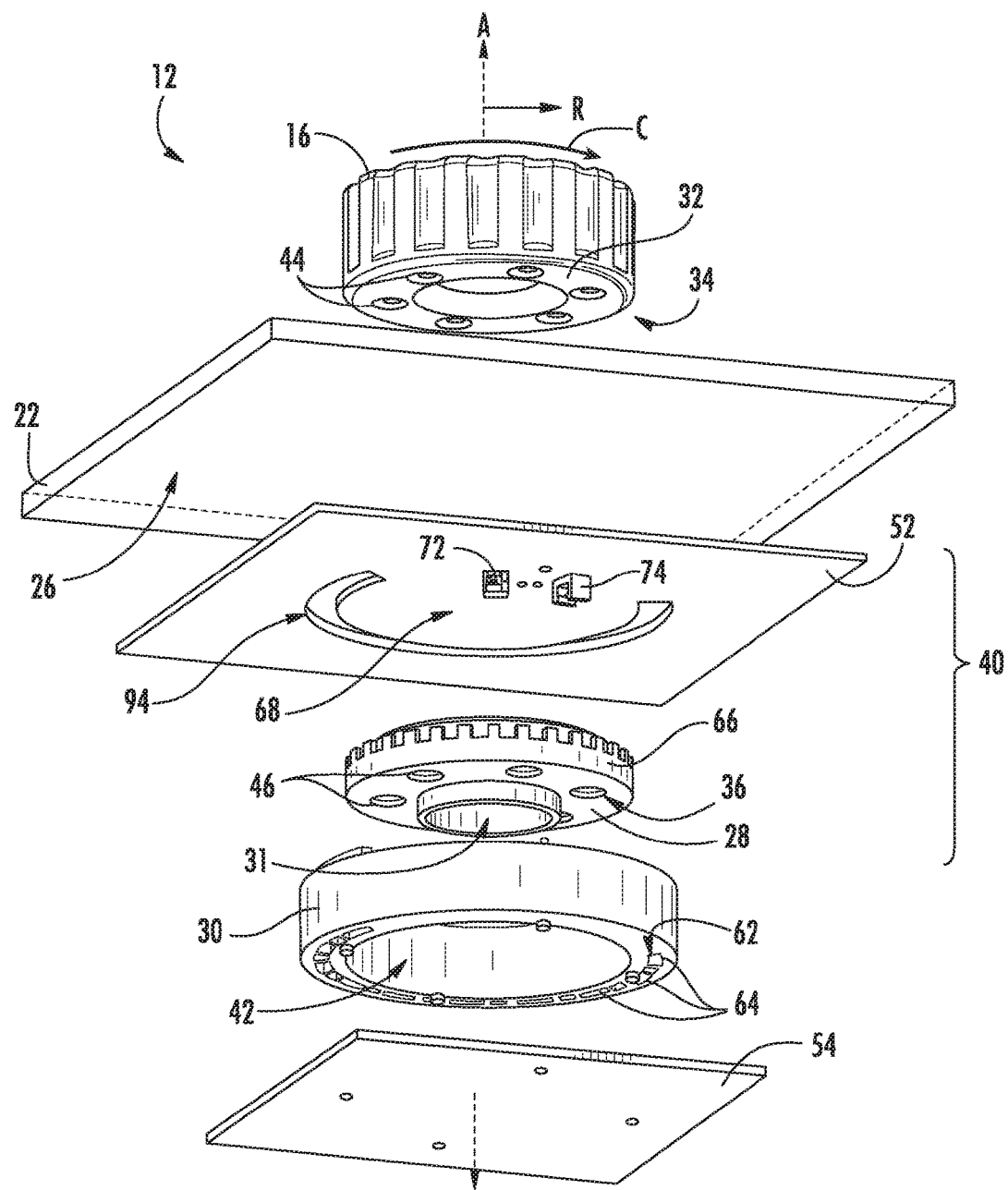
FIG. 6 provides an exploded bottom perspective view of the example knob assembly of FIG. 5.
Figure 7A:
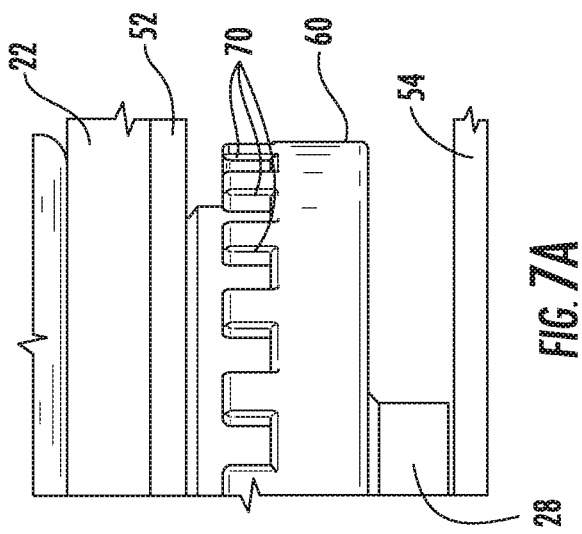
FIG. 7A provides a magnified side view of the example knob assembly of FIG. 7 along the area identified by 7A.
Figure 7:
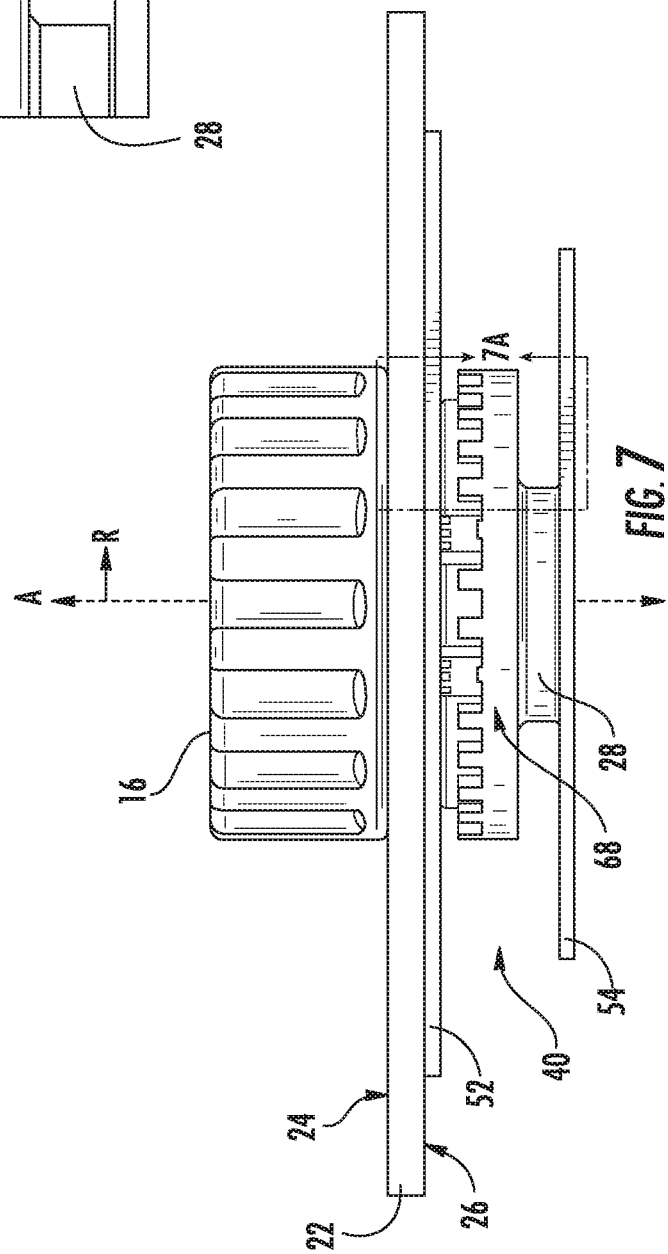
FIG. 7 provides a side view of the example knob assembly of FIG. 5.
Figure 11:
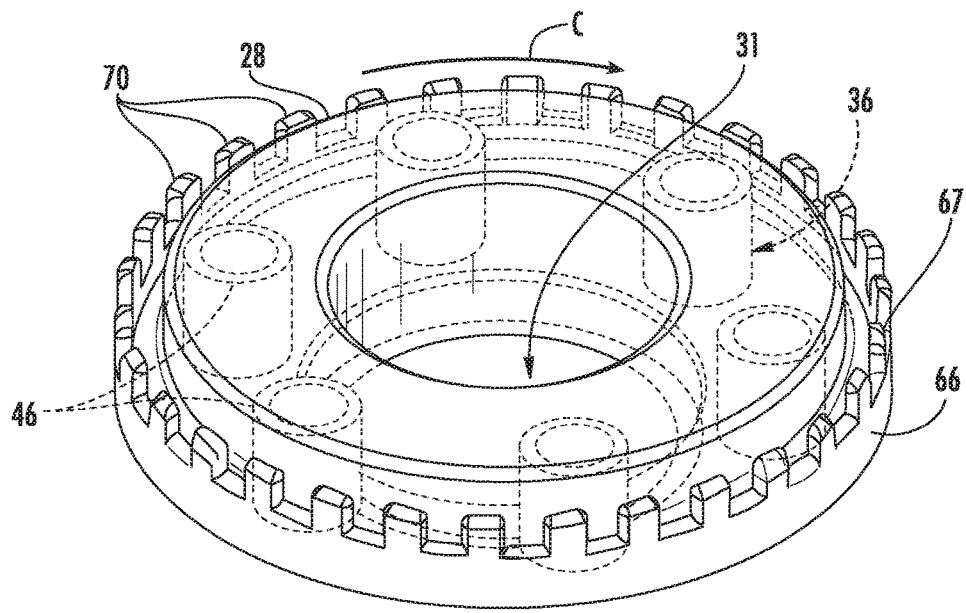
FIG. 11 provides a perspective view of the attractor plate of the example knob assembly of FIG. 5.
Figure 12:
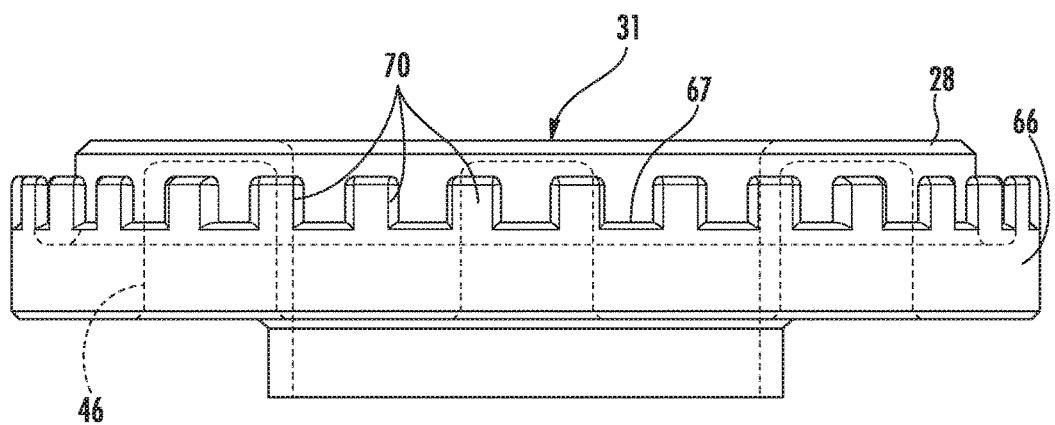
FIG. 12 provides a side view of the example attractor plate of FIG. 11.

Turning now to FIGS. 4 through 6, as well as FIGS. 11 and 12, one or both of first magnetic assembly 34 and second magnetic assembly 36 may include a plurality of radial magnetic elements 44, 46. Some embodiments of first magnetic assembly 34 include a plurality of magnetic elements 44 formed as slugs along a circumferential direction C about central axis A, e.g., in the mounted position. Each magnetic element 44 of first magnetic assembly 34 may be disposed at a discrete angular position within knob body 32, e.g., within a common plane. In other words, each radial magnetic element 44 may be disposed at a unique angle relative to the central axis A. Alternatively, first magnetic assembly 34 may include a singular magnetic element, such as a continuous ring formed about central axis A.

As shown, second magnetic assembly 36 may be generally matched to first magnetic assembly 34 and/or parallel thereto. In turn, second magnetic assembly 36 may include a plurality of magnetic elements 46 formed as slugs along a circumferential direction C about central axis A. Each magnetic element 46 of second magnetic assembly 36 may correspond to a discrete magnetic element 44 of first magnetic assembly 34. Additionally or alternatively, second magnetic assembly 36 may include a singular magnetic element, such as a continuous ring formed about central axis A.

In some embodiments, the first magnetic assembly 34 may include a plurality of permanent magnets disposed at discrete angular positions within knob body 32 while the second magnetic assembly 36 comprises a ferromagnetic material to selectively engage the plurality of permanent magnets of the first magnetic assembly 34. In other embodiments, first magnetic assembly 34 comprises a ferromagnetic material while second magnetic assembly 36 comprises a plurality of permanent magnets disposed at discrete angular positions about the central axis A to selectively engage the ferromagnetic material of the first magnetic assembly 34.

In some embodiments, control panel 22 may visually define a plurality of power level indicators 59, which may be an array of indicators 59 positioned on control panel 22 adjacent a periphery of control knob 16. In this regard, power level indicators 59 may form an arc of indicators 59 that are progressively illuminated as the power level of control knob 16 is increased from an inactive or "off" position to the maximum power level. According to the illustrated embodiments, power level indicators 59 form a semi-circular arc adjacent control knob 16. However, according to alternative embodiments, power level indicators 59 may form a complete circle around control knob 16, and may have different sizes, shapes, configurations, and colors.

During use, power level indicators 59 may be illuminated to provide a highly visible indication to the user of the particular position of control knob 16 and/or the temperature of heating element 18. As shown, in example embodiments, illumination of these indicators 59 is achieved by defining indicators 59 as, or within, a transparent or translucent portion of control panel 22. In some such embodiments, at least a portion of control panel 22 is constructed of transparent (clear or dark-tinted) glass, glass ceramic, or plastic material. For instance, in order to define precise areas of control panel 22 that transmit sufficient light to act as indicators 59, an opaque backing material (e.g., masking layer) (not shown) may be printed on an inner surface 26 of control panel 22 to define indicators 59. As described below, a lighting assembly 58 is positioned below control panel 22 to selectively illuminate indicators 59. In other words, the printed opaque layer may define various visual apertures or openings, e.g., transparent or translucent portions, which allow light to travel through the glass control panel 22 and be visible to a user of cooktop appliance 10. Top printed circuit board 52 may define an aperture 94 below indicators 59 through which light may be transmitted. Additionally, text or graphics may be printed within the clear openings of the opaque backing material such that they are visible when the indicators 59 are illuminated. In other embodiments, other suitable means of defining indicators 59 may be provided. For example, according to alternative embodiments, a separate opaque panel that may be cut or stamped to define indicators 59 may be attached to the underside of control panel 22.

As shown in FIGS. 2 through 6, control knob assembly 12 may further include lighting assembly 58. When assembled, at least a portion of lighting assembly 58 may be disposed radially outward from the attractor plate 28 to selectively illuminate a portion of the outer surface 24 of the control panel 22, e.g., at indicators 59. According to some embodiments, lighting assembly 58 is positioned at or behind inner surface 26 of control panel 22. Lighting assembly 58 may include one or more light sources 60 configured for illuminating a graphical display, e.g., indicators 59 on control panel 22 to indicate the power level of heating element 18.

Light source 60 of lighting assembly 58 may include any suitable light source or combination of light sources. For example, according to the illustrated embodiment, light source 60 may be or include a light emitting diode (LED), configured for illuminating as a single color, e.g., red, green, white, etc., or being capable of illuminating in more than one color, e.g., an R-G-B LED. As another example, light source 60 may include more than one LED and be capable of illuminating in different colors based on, for example, one or more operating conditions of heating element 18, cooking appliance 10, or both. As yet another example, light source 60 may be another electrical light source, such as one or more traditional light bulbs, e.g., grain of wheat bulbs, etc. Moreover, other arrangements of LEDs could be used at each light source 60 position of lighting assembly 58.

As shown, LEDs 60 may be distributed in a substantially circular pattern on a printed circuit board, e.g., base printed circuit board 54, and directed at the power level indicators 59. Base printed circuit board 54, and thus LEDs 60, may be positioned beneath control panel 22 such that LEDs 60 may be configured for selectively illuminating indicators 59 based on, e.g., operating conditions or the temperature of heating element 18. As shown, LEDs 60 associated with power level indicators 59 may be distributed along the circumferential direction C and may be spaced apart at a fixed radius that is larger than the radius of control knob 16. In this manner, power level indicators 59 may form an arc of LEDs 60 that are progressively illuminated as control knob 16 is rotated from the inactive or "off" position to a maximum heating position. It should be obvious to one skilled in the art that while the LEDs 60 are shown being mounted on the upper surface of base printed circuit board 54, "reverse mount" LEDs 60 may be mounted to the lower surface of base printed circuit board 54 with corresponding apertures in base printed circuit board 54 providing an optical path from the LEDs 60 through base printed circuit board 54. Moreover, alternative embodiments may include or provide LEDs 60 mounted on top printed circuit board 52 and directed to power level indicators 59.

In certain embodiments, a light guide 62 is further included between control panel 22 and base printed circuit board 54. For instance, light guide 62 may be disposed within retainer ring 30 between LEDs 60 and the inner surface 26 of the control panel 22. When assembled, light guide 62 may be configured for directing and concentrating light emitted from each of the plurality of LEDs 60 to a corresponding indicator 59. According to some example embodiments, light guide 62 may be comprised of an opaque material and configured with open air channels through which the light from LEDs 60 are constrained and directed to control panel 22 at indicators 59. Additionally or alternatively, light guide 62 may define one or more light pipes 64, e.g., within retainer ring 30. Each light pipe 64 may be formed from a transparent material, a translucent material, or both. Moreover, when assembled, each light pipe 64 may correspond with one of the plurality of LEDs 60 and may be configured to receive light emissions from that LED 60 (or any other suitable light source) and transmit the light along the length of the corresponding light pipe 64 to precisely illuminate the corresponding indicator 59. In this manner, a sharp, high-contrast graphical display may communicate the angular position of control knob 16 and the status of heating element 18 to the user.

Turning now to FIGS. 7 through 12, in some embodiments, an electrical position sensor 40 is provided that includes an optical encoder disc 66 and an optical sensor assembly 68. Together, optical encoder disc 66 and optical sensor assembly 68 may provide precise feedback regarding positioning (e.g., a relative angular position or movement) of attractor plate 28 about the central axis A. During use, the feedback regarding positioning may be communicated to the user, e.g., via illuminating indicators 59. More specifically, as will be described in detail below, optical encoder disc 66 may be operably coupled to attractor plate 28 and positioned adjacent optical sensor assembly 68. During operations, optical encoder disc 66 may be configured to break (or reflect) the optical signals emitted from one or more optical sensors to generate pulse signals. A controller, e.g., controller 38 (FIG. 1), may use the pulse signals to determine the angular position of optical encoder disc 66, and consequently, the angular position of control knob 16 and/or attractor plate 28. In some embodiments, the optical signals may be infrared light beams 76 and optical encoder disc 66 may be constructed from an optically opaque material such that the rotation of optical encoder disc 66 intermittently blocks the transmission of the infrared beams. However, one skilled in the art will appreciate that optical encoder disc 66 may be made from any suitable material that is detectable by optical sensor assembly 68.

According to the illustrated embodiment, optical encoder disc 66 is a circular ring that is fixed to attractor plate 28, e.g., such that optical encoder disc 66 rotates with attractor plate 28. For instance, optical encoder disc 66 may be integrally formed on or with attractor plate 28 (i.e., as a unitary monolithic element). As shown, optical encoder disc 66 generally includes a plurality of teeth 70 that are in operable communication with optical sensor assembly 68. For example, the plurality of teeth 70 may extend from a circumference or perimeter 67 of optical encoder disc 66. Moreover, teeth 70 may extend parallel the central axis A. Teeth 70 are generally fixed in size and spacing and define an arc at a fixed radius. In some embodiments, teeth 70 extend from the perimeter 67 of optical encoder disc 66 toward control panel 22 and/or top printed circuit board 52. In alternative embodiments, other configurations of a printed circuit board and optical encoder disc 66 are provided to operably couple teeth 70 with optical sensor assembly 68. In this manner, as optical encoder disc 66 rotates, teeth 70 may pass through and break the optical sensors 74, 76 mounted on top printed circuit board 52 to generate the pulse signal. Notably, according to alternative embodiments, teeth 70 may extend from optical encoder disc 66 and/or attractor plate 28 at any radial location. Moreover, according to some embodiments, multiple rows of teeth 70 may be positioned at different radiuses and may be in operable communication with different optical sensor assemblies.

Figure 8:
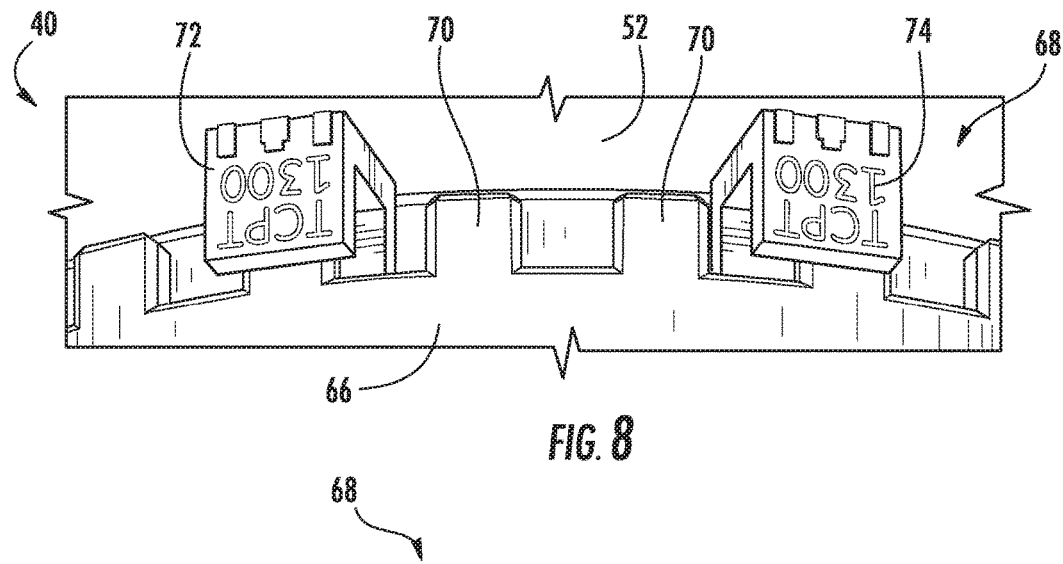
FIG. 8 provides a perspective view of an optical sensor assembly mounted to a printed circuit board of the example knob assembly of FIG. 5.
Figure 9:
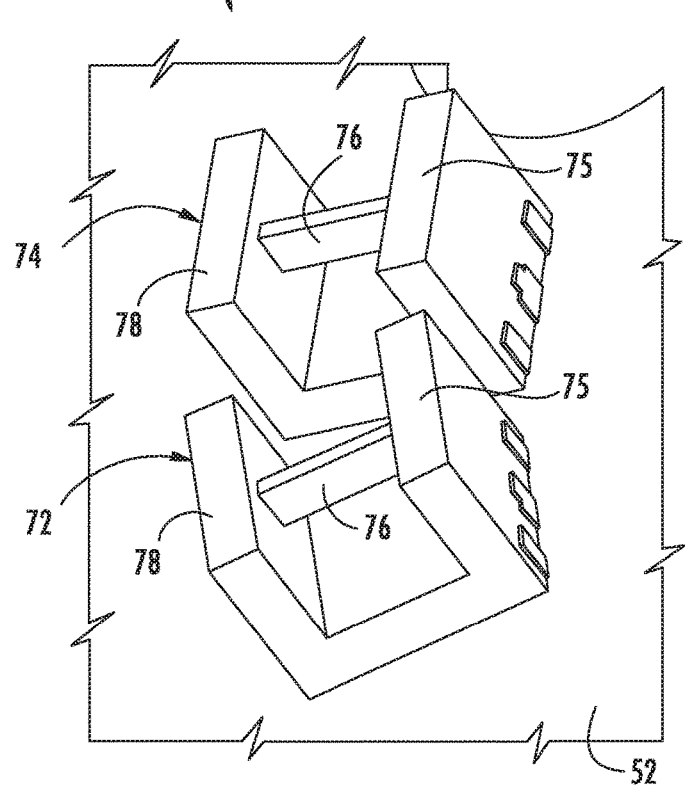
FIG. 9 provides a perspective view of optical sensors of the optical sensor assembly of FIG. 8.
Figure 10:
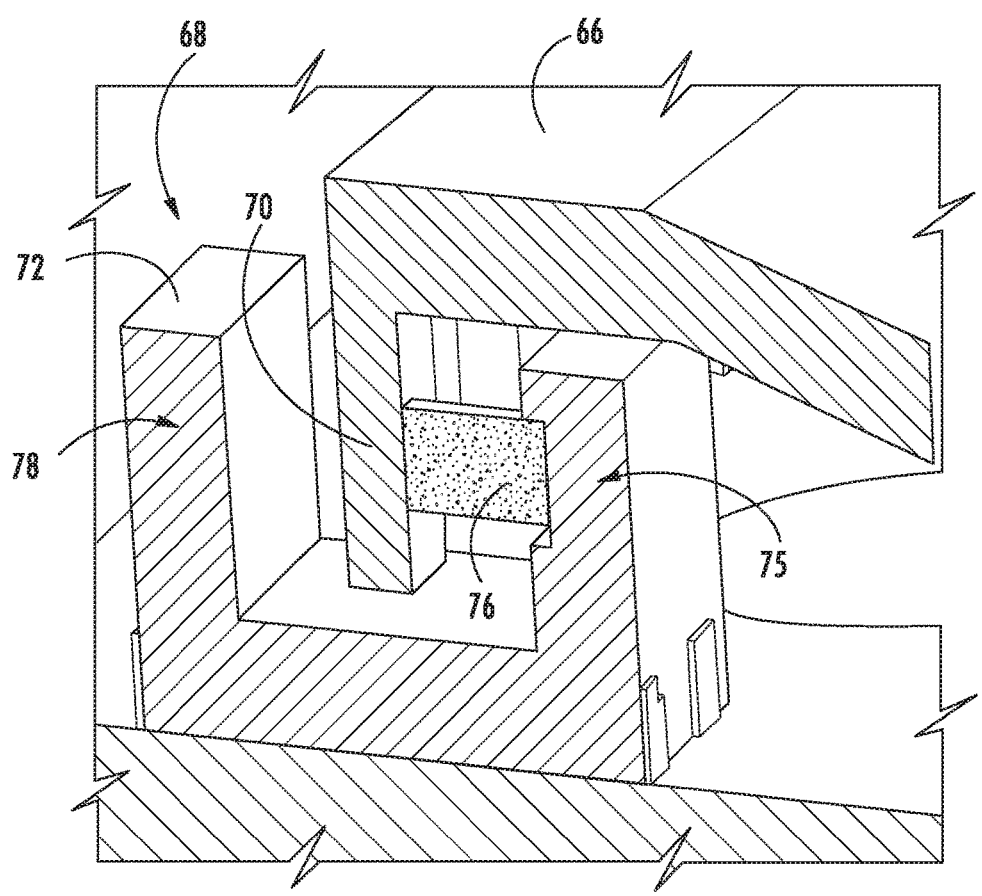
FIG. 10 provides a close-up perspective view of one of a plurality of teeth of the optical encoder disc engaging one optical sensor of the optical sensor assembly according to an example embodiment of the present disclosure.

As shown in FIGS. 8 through 10, optical sensor assembly 68 may be mounted on a printed circuit board, e.g., top printed circuit board 52. Top printed circuit board 52 may be rigidly connected to control panel 22 such that the optical sensors 74, 76 do not move as control knob 16 and/or attractor plate 28 rotate. In some embodiments, printed circuit board 52 may be mounted to control panel 22 using any suitable mechanical fastener, such as screws, bolts, rivets, etc. Similarly, adhesives, bonding, snap-fit mechanisms, interference-fit mechanisms, or any suitable combination thereof be used to join printed circuit board 52 to control panel 22.

Optical sensor assembly 68 may include one or more optical sensors (e.g., sensors 74 and 76) that are configured to detect the movement of teeth 70 of optical encoder disc 66. Although referred to herein as optical sensors for purposes of explaining example embodiments, any suitable sensor may be used. More specifically, another suitable sensor may have a detection point at which the sensor may detect the presence or absence of one of the plurality of teeth 70, as described in more detail below. For example, as best shown in FIGS. 8 through 10, an example optical sensor may include an emitter that emits an optical signal and a detector that is configured to receive that optical signal. In some embodiments, an example optical sensor may be an infrared sensor that comprises an infrared emitter 75 that emits an infrared light beam 76 toward an infrared detector 78. Optical encoder disc 66 is operably coupled to attractor plate 28 such that teeth 70 are positioned between infrared emitter 75 and infrared detector 78 and freely move through each optical sensor of optical sensor assembly 68 as attractor plate 28 rotates. When teeth 70 of optical encoder disc 66 pass through the example optical sensor, each of the teeth 70 breaks the infrared light beam 76 from being received by infrared detector 78, thereby creating a pulse signal detected by a controller that may be mounted, for example, on top printed circuit board 52. In this manner, teeth 70 may break infrared light beam 76 from each optical sensor (as described above) and the signal generated may be used to accurately determine the angular position of optical encoder disc 66, and thus attractor plate 28 and/or control knob 16.

Although optical sensor assembly 68 is illustrated as including a plurality of vertically oriented slot interrupter sensors, one skilled in the art will appreciate that this is only an example embodiment used for the purpose of explaining aspects of the present disclosure. Other optical sensor types and configurations may be used while remaining within the scope of the present disclosure. For example, optical encoder disc 66 may define a plurality of radially extending teeth 70 that are operably coupled with one or more horizontally mounted slot interrupter sensors. Alternatively, one or more reflective optical sensors (not pictured) may be used to sense a plurality of reflective portions of an optical encoder disc 66 as the disc rotates with attractor plate 28. Other configurations of optical encoder disc 66 and optical sensor assembly 68 are contemplated as within the scope of the present disclosure.

As shown, in some embodiments, optical sensor assembly 68 includes a first optical sensor 74 and a second optical sensor 76. During operations, first optical sensor 74 generates a first pulse signal. Second optical sensor 76 may be positioned adjacent first optical sensor 74 and generate a second pulse signal. Based on these two signals quadrature encoding may be used to determine both the incremental motion and direction of motion of optical encoder disc 66, as is known in the art. This information may be used to accurately determine the position of attractor plate 28.

According to quadrature encoding, the first pulse signal (e.g., associated with first optical sensor 74) and the second pulse signal (e.g., associated with second optical sensor 76) are approximately 90 degrees out of phase from each other. This phase offset may be achieved by configuring the spacing of teeth 70 and the position of first optical sensor 74 relative to second optical sensor 76, e.g., such that a central portion of tooth 70 is positioned on the center of first optical sensor 74 while an edge of the same (or another) tooth 70 is positioned on the center of second optical sensor 76. In turn, the offset positions of one or more teeth 70 may cause the second pulse signal to change state. By determining which pulse signal is lagging the other (i.e., which signal is changing while the other signal is stable) the direction of rotation may be determined. For instance, if the first pulse signal is stable (i.e., center of a tooth 70 centered on first optical sensor 74) and the second pulse signal is transitioning (i.e., edge of a tooth 70 passing center of second optical sensor 76, thus changing state) then it can be determined that optical encoder disc 66 is turning in a first direction (e.g., clockwise) if the second pulse signal is changing from low to high (i.e., 0 to 1), or is turning in a second direction (e.g., counter-clockwise) if the second pulse signal is changing from high to low (i.e., 1 to 0). Likewise, the state transition of the first pulse signal can be used to determine the encoder's rotational direction while the second pulse signal is stable.

Although two optical sensors 74, 76 are described above, the size and spacing of teeth 70 and the number and location of optical sensors 74, 76 may be configured differently in alternative embodiments. Indeed, any number, size, spacing, and configuration of teeth 70 and optical sensor assembly 68 may be used, such that teeth 70 and optical sensor assembly 68 are in operable communication and provide one or more signals to a controller that may use the signals to precisely determine the angular position of attractor plate 28 and thus control knob 16. For example, a single optical sensor may be used to detect incremental rotation (speed) of control knob 16.

One skilled in the art would also recognize that other encoding schemes could be utilized, such as "greycode" or simple "binary-coded decimal", in which case optical encoder disc 66 would have multiple toothed rings, each passing through/by one of the sensors. The benefit of quadrature encoding is it minimizes the number of sensors, and the complexity of the encoder disc, while providing for a large number of sensed rotational positions (i.e., it can readily resolve a large number of positions around the knob with minimal complexity).

One skilled in the art would also recognize that in addition to optical encoding (as explained above) one could utilize magnetic encoding to perform the same functionality. In some situations, magnetic encoding might be advantageous over optical encoding, particularly where robustness to dirt, dust, or liquid intrusion is required (for instance, in a piece of industrial equipment). That is, rather than using an optical encoder disc and infrared optical sensors, one could use a ferrous (or magnetically polarized) encoder disc and magnetic sensors (e.g., Hall Effect, Magneto-Resistive, Variable Reluctance, etc.).

Returning to FIGS. 5 and 6, in some embodiments, a presence sensor 56 is mounted behind control panel 24 to detect control knob 16 in the mounted position. During operations, the presence sensor 56 may thus determine whether control knob 16 is disposed on control panel 24 in the mounted position. For instance, detection signal may be transmitted by presence sensor 56 to a controller, e.g., controller 38 (FIG. 1), upon detection of control knob 16. In turn, the controller may be configured to require reception of detection signal before or during activation heating element 18 (FIG. 1). Advantageously, heating element 18 may be instantly deactivated or prevented from activating when control knob 16 is not mounted to control panel 22.

In some such embodiments, presence sensor 56 is a capacitive detection panel mounted between control panel 22 and attractor plate 28. For instance, capacitive detection panel 56 may be mounted on top printed circuit board 52, as shown in FIG. 10. In some embodiments, capacitive detection panel 56 is formed in a circular pattern, e.g., along circumferential direction C, on top printed circuit board 52. Moreover, capacitive detection panel 56 may generally correspond to the footprint of first magnetic assembly 34 and second magnetic assembly 36, e.g., therebetween. Alternatively, capacitive detection panel 56 may be formed in another shape, e.g., as a square or rectangle, between first magnetic assembly 34 and second magnetic assembly 36.

During use, capacitive detection panel 56 may detect magnetic engagement between first magnetic assembly 34 and second magnetic assembly 36 (e.g., when control knob 16 is in the mounted position). Accordingly, as control knob 16 is placed in the mounted position, capacitive detection panel 56 may detect the variation in capacitance caused by the increased magnetic field strength. The detected variation may be communicated as a detection signal, e.g., received by controller 38.

Optionally, attractor plate 28, including second magnetic assembly 36 may slide along central axis A. For instance, compartment 42 may have an axial height H1 greater than an axial height H2 of attractor plate 28. Thus, attractor plate 28 may be generally able to slide along central axis A within compartment 42. Gravity, or another biasing force, may generally motivate attractor plate 28 downward away from control panel 22. In turn, the presence of control knob 16, including first magnetic assembly 34, in the mounted position may draw attractor plate 28 upward toward control panel 22, generating a variation in capacitance to be detected at capacitive panel 56.

In alternative embodiments, the presence sensor may be one or more other suitable sensors for determining that control knob 16 is in the mounted position. For instance, the presence sensor may be provided as an optical sensor transmitting a light beam through control panel 22. A reflective surface may be provided on a bottom portion of control knob 16 and thereby reflect the transmitted light beam. The reflected light beam may be received at the optical sensor and subsequently transmit a responsive detection signal, e.g., to controller 38.

Turning now to FIGS. 13 through 16, additional embodiments of knob assembly 12 are illustrated. It is understood that that knob assembly 12 of FIGS. 13 through 16 may include each feature of the above-described embodiments. Similarly, any of the features described with respect to the embodiments of FIGS. 13 through 16 may be used or incorporated into the embodiments of FIGS. 1 through 12, except as otherwise indicated.

Figure 13:
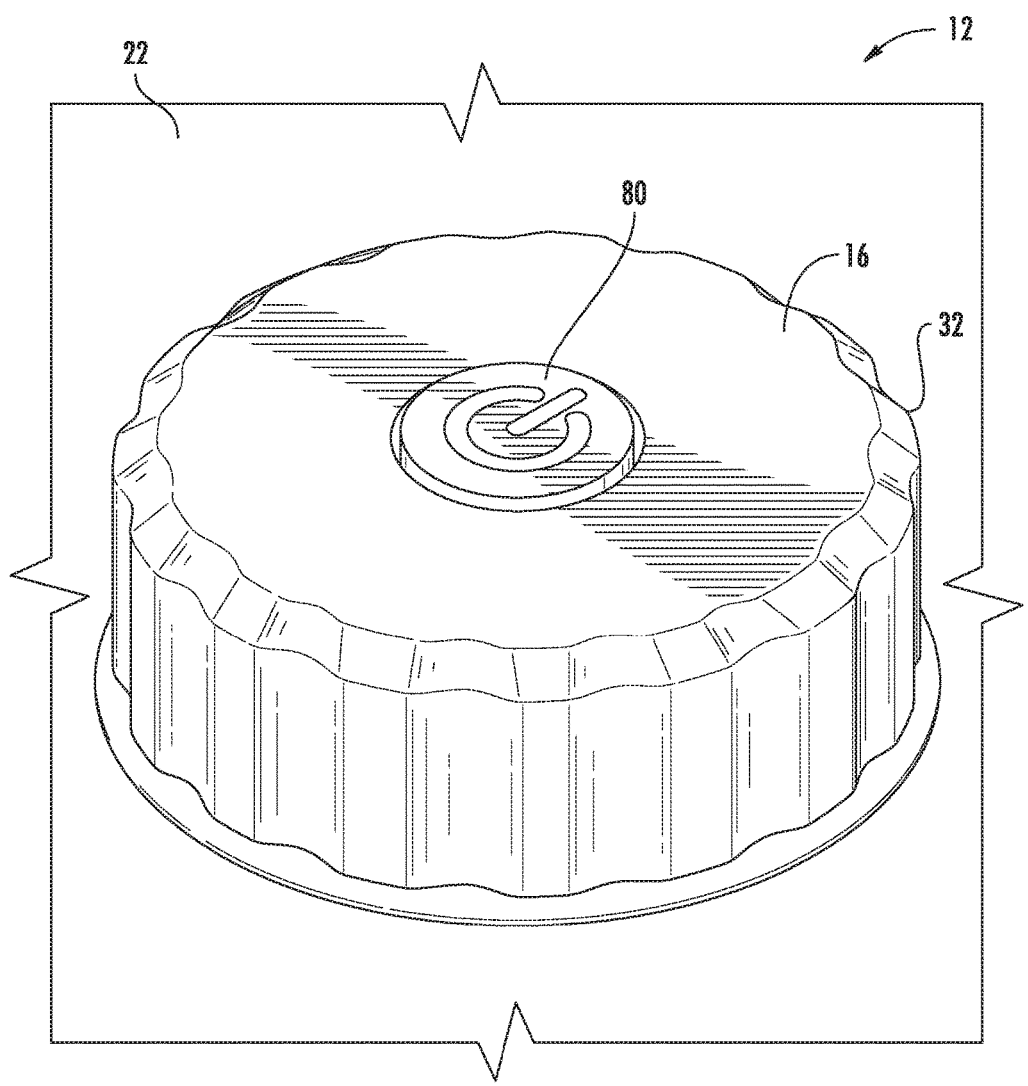
FIG. 13 provides a perspective view of a knob assembly according to example embodiments of the present disclosure.
Figure 14:
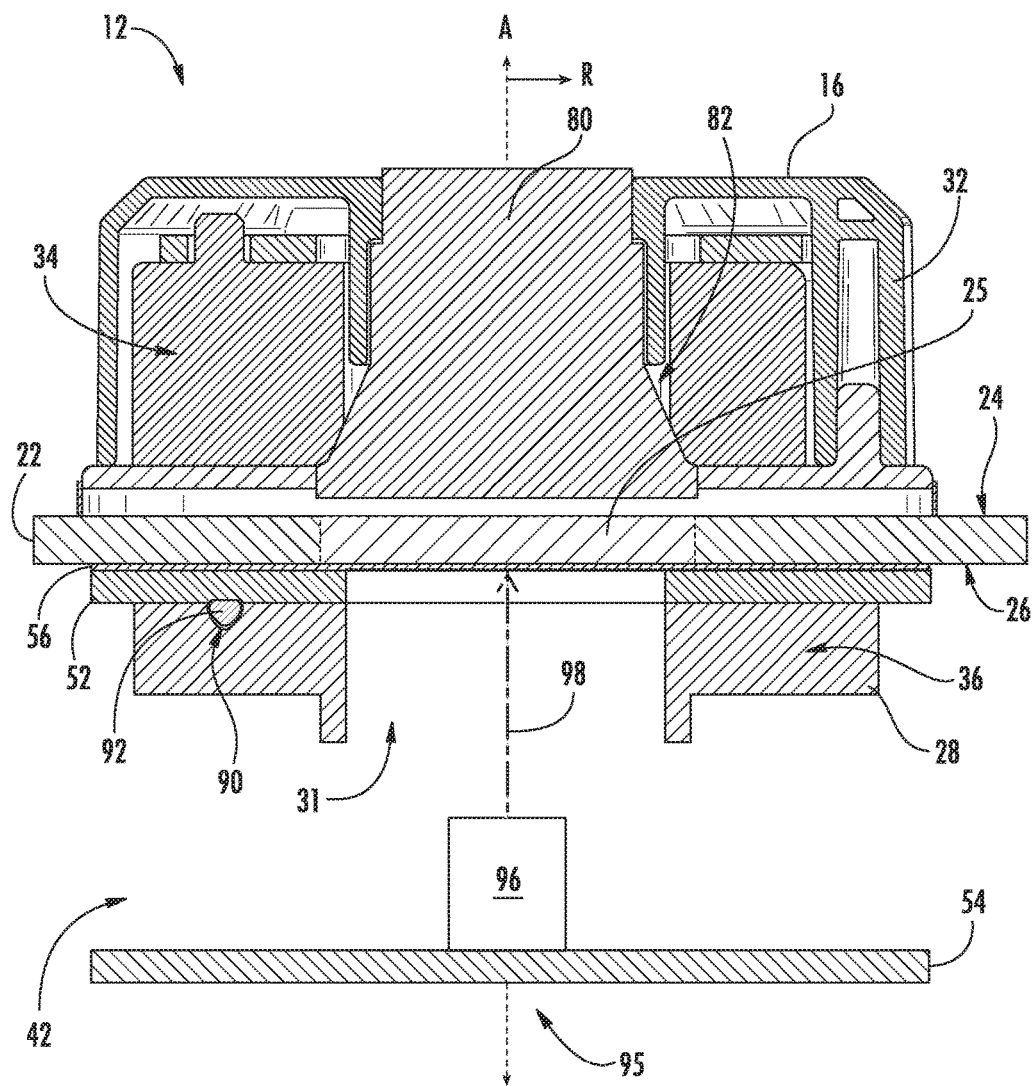
FIG. 14 provides a cross-sectional side view of a knob assembly according to example embodiments of the present disclosure.

As shown in FIGS. 13 and 14, an internal member 80 is supported on or within knob body 32. For instance, internal member 80 may be received within a central cavity 82 defined by knob body 32, e.g., coaxial with central axis A. When control knob 16 is in the mounted position, knob body 32 may engage or contact control panel 22, as described above. Optionally, a light assembly, e.g., secondary lighting assembly 95, may be provided below control panel 22. Attractor plate 28 may define an internal aperture 31 along the central axis A to receive a secondary light emission, e.g., as represented by line 98. In some embodiments, a light emission may be transmitted from a secondary light source 96 mounted radially inward from attractor plate 28 on base printed circuit board 54. Secondary light source 96 may be any suitable light source, such as a single-color or multi-color LED. Generally, Secondary light source 96 may be configured for illuminating control knob 16, e.g., at internal member 80 to indicate the activation or deactivation of heating element 18.

In some embodiments, at least a portion of control panel 22 positioned directly behind or below internal member 80 in the mounted position may be a generally transparent or translucent portion 25 of control panel 22 formed as described above. In turn, secondary light source 96 may illuminate internal member 80, e.g., by transmitting a light emission through control panel 22 and to internal member 80. In some such embodiments, internal member 80 is formed as a translucent or transparent light guide. Secondary light emissions from control panel 22 may thus be transmitted through internal member 80 and, e.g., above knob body 32. When assembled, internal member 80 may thus be illuminated to indicate, for example, the state of a heating element 18 (FIG. 1) (e.g., wherein illumination of a predetermined color or illumination generally indicates heating element 18 is active or inactive).

Figure 15:
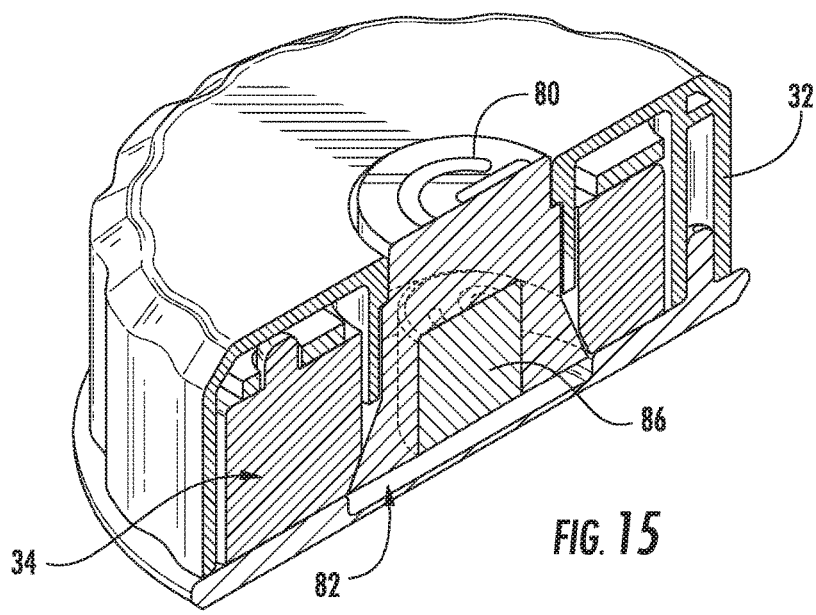
FIG. 15 provides a cross-sectional side view of a knob assembly according to example embodiments of the present disclosure.
Figure 16:
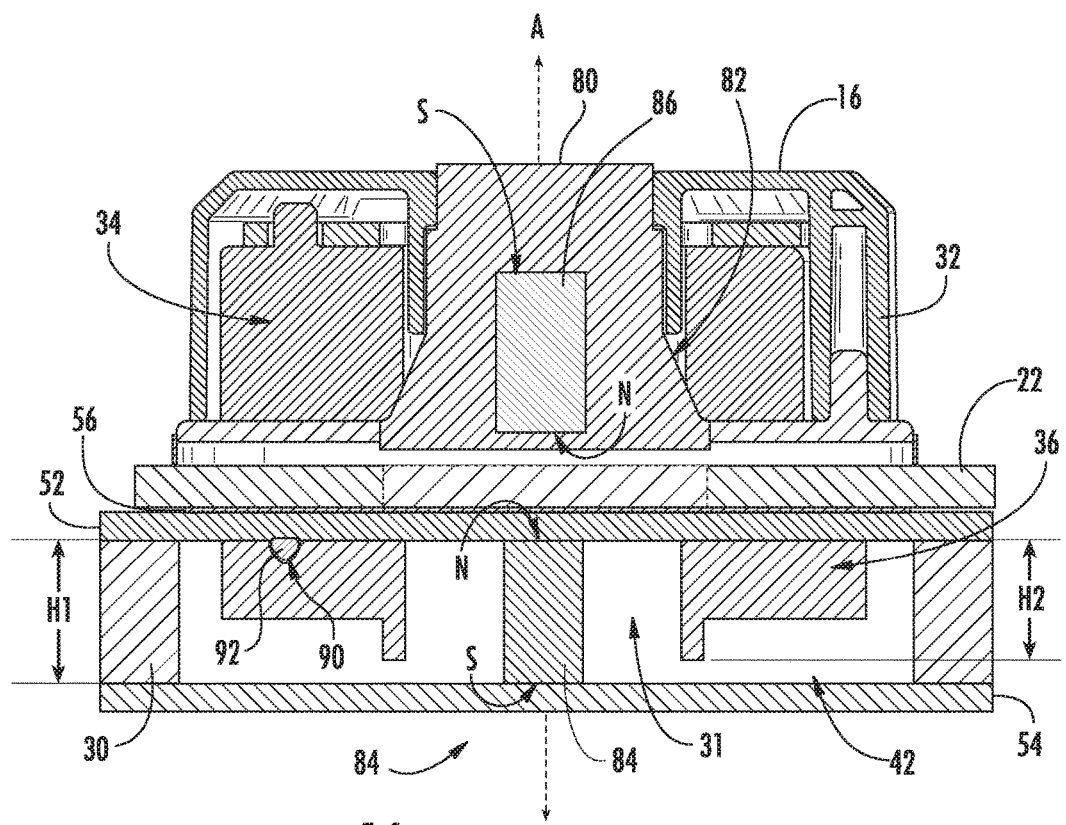
FIG. 16 provides a cross-sectional side view of the example knob assembly of FIG. 15.

As shown in FIGS. 15 and 16, some embodiments of control knob 16 provide internal member 80 as an axially slidable member. When control knob 16 is in the mounted position, knob body 32 may engage or contact control panel 22, as described above. Internal member 80 may act under push-button engagement, e.g., as motivated by user. Thus, during use, slidable member 80 may slide axially (e.g., along central axis A) within central cavity 82 to selectively contact control panel 22.

In certain embodiments, a repelling assembly 84 is provided to bias internal member 80 away from control panel 22. In some such embodiments, a first repelling magnet 86 is mounted within internal member 80 in a first pole direction. A second repelling magnet 88 is mounted behind control panel 22 (e.g., on attractor plate 28) in a second pole direction. In the mounted position, first repelling magnet 86 and second repelling magnet 88 may be coaxial, e.g., about the central axis A. As shown, the second pole direction is opposite from first pole direction. In other words, the north-south poles of first repelling magnet 86 are oriented to act against the north-south poles of second repelling magnet 88. As an example, the north pole (N) of first repelling magnet 86 may be directed toward control panel 22 (e.g., downward along the central axis A) while the north pole (N) of second repelling magnet 88 is also directed toward control panel 22 (e.g., upward along the central axis A). In turn, an external force, such as an input force provided by a user, may be required to overcome the biasing force of the opposing repelling magnets 86, 88 and bring internal member 80 into contact or engagement with control panel 22, e.g., at the outer surface 24.

In additional or alternative embodiments, capacitive detection panel 56 may be mounted between the first repelling magnet 86 and second repelling magnet 88. When assembled, presence detection panel 56 may detect the variation in capacitance caused by the engagement of internal member 80 with control panel 22. The detected variation may be communicated as a detection signal, e.g., received by controller 38 to activate heating element 18 (FIG. 1).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A knob assembly for an appliance, the knob assembly comprising:
    a control panel having a planar outer surface and an opposite inner surface;
    a control knob selectively disposed on the control panel at the planar outer surface, the control knob comprising a knob body and a first magnetic assembly rotatable about a central axis extending perpendicular to the control panel;
    an attractor plate mounted behind the control panel about the central axis, the attractor plate comprising a second magnetic assembly in selective magnetic engagement with the first magnetic assembly;
    an electrical position sensor directed at the attractor plate and configured to detect positioning of the attractor plate about the central axis; and
    a retainer ring disposed radially outward from the attractor plate to define a compartment having a height greater than a height of the attractor plate and within which the attractor plate is slidably disposed to move along the central axis in response to the control knob disposed on the control panel.

2. The knob assembly of claim 1, wherein the electrical position sensor comprises an encoder disc and a plurality of optical sensors, wherein the encoder disc comprises a plurality of teeth operably coupled to the attractor plate, and wherein the plurality of sensors are mounted on adjacent the encoder disc such that the plurality of sensors detect the motion of the plurality of teeth to determine the angular position of the attractor plate.

3. The knob assembly of claim 1, further comprising a lighting assembly disposed radially outward from the attractor plate to illuminate a portion of the outer surface of the control panel.

4. The knob assembly of claim 3, wherein the retainer ring comprises a light guide positioned between the lighting assembly and the inner surface of the control panel.

5. The knob assembly of claim 1, wherein the attractor plate comprises a plurality of teeth about the central axis, and wherein the electrical position sensor is an optical sensor configured to detect movement of the plurality of teeth.

6. The knob assembly of claim 1, further comprising a presence sensor mounted behind the control panel to detect the control knob in a mounted position on the control panel.

7. The knob assembly of claim 1, further comprising a lighting assembly mounted radially inward from the attractor plate, wherein the control knob comprises a central light guide to receive a light transmission from the lighting assembly.

8. The knob assembly of claim 1, wherein the knob body is disposed in rotational contact with the outer surface at a mounted position, wherein the control knob further comprises a slidable member supported on the knob body to move along the central axis in selective engagement with the outer surface at the mounted position.

9. The knob assembly of claim 8, further comprising a repelling assembly biasing the slidable member away from the outer surface at the mounted.

10. The knob assembly of claim 7, wherein the knob body is disposed in rotational contact with the outer surface at a mounted position, wherein the central light guide comprises a slidable member supported on the knob body to move along the central axis in selective engagement with the outer surface at the mounted position.

11. The knob assembly of claim 10, further comprising a repelling assembly biasing the slidable member away from the outer surface at the mounted position.

12. The knob assembly of claim 7, further comprising a capacitive detection panel mounted between the control panel and the lighting assembly.

13. The knob assembly of claim 7, further comprising an outer lighting assembly disposed radially outward from the attractor plate to illuminate a portion of the outer surface of the control panel.

14. The knob assembly of claim 13, wherein the retainer ring comprises a light guide positioned between the outer lighting assembly and the inner surface of the control panel.

15. The knob assembly of claim 9, further comprising a capacitive detection panel mounted between the control panel and the repelling assembly.

\* \* \* \* \*